April 14, 1970 KEIICHI NAKAMURA 3,506,502

METHOD OF MAKING A GLASS PASSIVATED MESA SEMICONDUCTOR DEVICE

Filed June 5, 1967

INVENTOR.
KEIICHI NAKAMURA

BY Hill, Sherman, Meroni, Gross & Simpson ATTORNEYS

United States Patent Office 3,506,502
Patented Apr. 14, 1970

3,506,502

METHOD OF MAKING A GLASS PASSIVATED MESA SEMICONDUCTOR DEVICE

Keiichi Nakamura, Tokyo, Japan, assignor to Sony Corporation, Tokyo, Japan, a corporation of Japan
Filed June 5, 1967, Ser. No. 652,645
Int. Cl. H01l 7/46
U.S. Cl. 148—174 7 Claims

ABSTRACT OF THE DISCLOSURE

A passivated semiconductor device having two glassy layers in a double mesa configuration surrounding P-N junctions. The glassy layers are produced by diffusing a glass former into the semiconductor under oxidizing conditions at a temperature below the melting point of the semiconductor material.

FIELD OF THE INVENTION

Figures 1, 2, 3, 4, 5, 6, 7, 8:
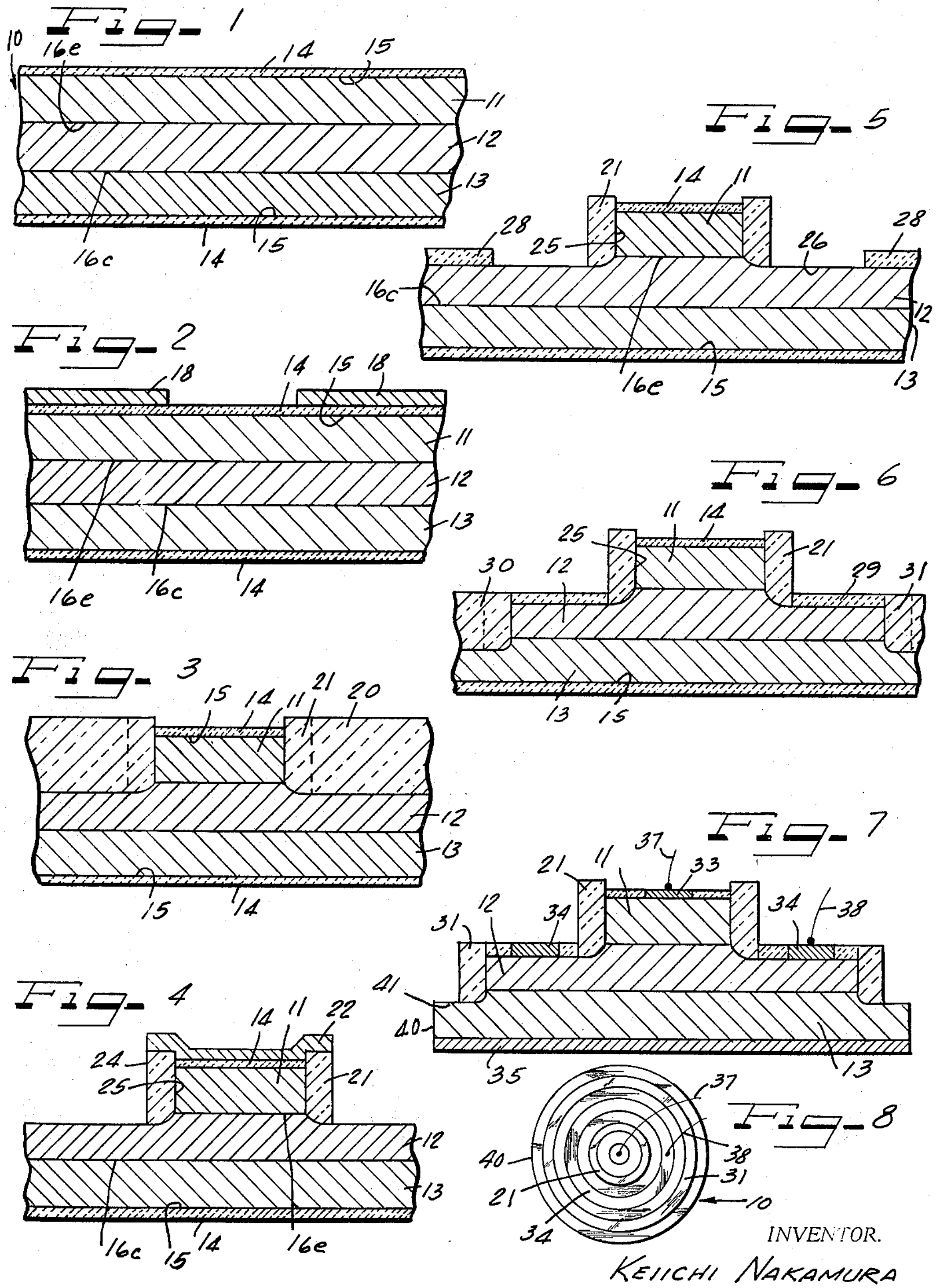

This invention relates to a passivated semiconductor device and a method of making the same, wherein exposed P-N junctions are protected by the interposition of a glassy layer formed by reaction of the substrate with a glass forming material under oxidizing conditions at a temperature below the melting point of the substrate.

DESCRIPTION OF THE PRIOR ART

It is known that semiconductor devices are subject to deterioration at their P-N junctions, particularly where the junction is at or near the surface. The deterioration may bridge the junction, thus degrading the device for high temperature operations, and for operation under conditions of high reverse voltages.

In the past, it has been suggested that an oxide surface layer of the semiconductor material be formed over the surface of the semiconductor device at suitably elevated temperatures. In the case of a silicon substrate, oxidation is typically accomplished at temperatures ranging from about 1100° to 1400° C. This severe oxidation treatment sometimes leads to channeling under the oxide layer, and mechanical distortion resulting from the difference between the thermal expansion coefficients of the substrate and the oxide layer. This oxidation treatment may also result in producing variations in the electrical characteristics of the device. In addition, the high temperature treatment used in forming the oxide layer tended to cause diffusion in the area of the P-N junctions.

Generally a mesa transistor is useful for high voltage applications because of its flat P-N junctions, but has a greater leakage current than a passivated ordinary transistor because of directly exposed ends of the P-N junction.

SUMMARY OF THE INVENTION

The present invention provides a method for forming a passivated semiconductor device having two passivating layers surrounding two flat P-N junctions. The passivating layers are formed at relatively low temperatures, thereby inhibiting the formation of channels under the layers so that the device is free from short-circuiting between the electrodes and has excellent reverse voltage characteristics. By suitable selection of materials the thermal-expansion coefficient of the glassy layer and the substrate can be rendered such that the device can operate under severe thermal conditions for a long period of time. In addition, the device of the present invention has the P-N junctions covered at their ends so that the semiconductor devices produced in accordance with this invention can be used under conditions of high voltage.

The passivated semiconductor of the present invention employs a glass former material which can be readily oxidized and combined with a semiconductor substrate and has an alloying temperature lower than the melting point of the substrate. Typically, the glass former is deposited on the substrate by vapor deposition and the substrate is then heated in an oxygen atmosphere so that the glass forms and combines with the substrate and at the same time the resulting alloy is oxidized, providing a glassy layer at a relatively low temperature. The heating temperature is dependent upon the material of the substrate and the nature of the glass. With a silicon substrate, the glass layer can be formed at temperatures ranging from about 500° to 1000° C. The preferred glass former in accordance with the present invention is lead but other elements and mixtures thereof such as aluminum, beryllium, magnesium, zinc, cadmium, tin and halides can also be employed.

Accordingly, it is an object of the present invention to provide a passivated semiconductor device and a method for making the same for high voltage use and having low leakage current.

Another object of the present invention is to provide a passivated semiconductor having two flat P-N junctions and two mesas.

A further object of the present invention is to provide a passivated semiconductor which is suitable for mass production.

Yet another object of this invention is to provide a passivated semiconductor which is reliable and economical.

Many other advantages, features and additional objects of the present invention will become manifest to those versed in the art upon making reference to the detailed description and the accompanying sheet of drawings in which a preferred structural embodiment incorporating the principles of the present invention is shown by way of illustrative example.

ON THE DRAWINGS

FIGS. 1 to 7 are greatly enlarged cross-sectional views of the successive steps involved in producing a passivated semiconductor in accordance with the present invention; and FIG. 8 is an enlarged plan view of a completed semiconductor device according to the present invention.

AS SHOWN IN THE DRAWINGS

The principles of this invention are particularly useful when embodied in a passivated semiconductor as illustrated in FIGS. 1–8. In the succeeding description, the method of the present invention will be described as applied to the manufacture of silicon semiconductor devices using lead or lead oxide as the glass forming material.

In FIG. 1, reference numeral 10 indicates generally a silicon semiconductor NPN substrate such as one produced from a P-type material which has been doped with N-material from opposite sides thereof by diffusion. The substrate 10 is formed of regions of negative and positive conductivity in layers 11, 12 and 13, respectively, such that the two flat P-N junctions **16*c* and 16*e* are formed. The substrate 10 is heated to a temperature of approximately 800° C. in an oxidizing atmosphere, thereby forming an oxide layer 14 composed of silicon dioxide on the surfaces 15 of the N-material 11 and 13**.

The donor impurities diffused in the substrate 10 may be phosphorous, arsenic or antimony.

A glass former layer 18 of lead or lead oxide is vacuum deposited on the substrate over a selected area of the N-region 11. The silicon substrate 10 is then heated in an oxidizing atmosphere with a temperature, for example, of from 700–900° C., and preferably at approximately 800° C., to provide a glassy layer 20 in the substrate 10 downwardly from the surface of the substrate. Consequently, the P–N junction 16*e* is surrounded by the glassy layer 20. This reduces the possibility of contamination of the P-N junction 16*e* by the atmosphere, improving the reliability thereof, FIG. 3.

A metal mask 22 is then disposed over the exposed silicon dioxide layer 14 which overlies the surface 15 and a glass area 21 of the glassy layer 20. The formation of the metal mask 22 may be accomplished by vacuum deposition of a metal such as gold or platinum. The glassy layer 20 is then removed by etching except from the glass area 21 surrounding the outside 25 of a first mesa 24. The metal mask 22 protects both the glass area 21 and the layer 14 on the N-region 11. The first mesa 24 is thereby passivated. This includes the emitter junction 16*e*. In etching the glassy layer 20, the surface 26 of the base or P-region 12 is exposed.

In a similar manner, a second glass former 28 is selectively deposited on the surface 26 of the base region 12. The substrate is heated in an oxidizing atmosphere as above at about 800° C. forming a silicon dioxide layer 29 and a glassy layer 30 which extends through the base region 12 to the surface 41 of the collector region 13 thereby overlying the collector junction 16*c*, FIG. 6.

The silicon dioxide layer 14 is selectively removed, FIG. 7, and the surface of the substrate 10 at the exposed portions is covered with a deposit of tungsten 33, 34 and 35 as is conventional.

The tungsten deposits 33, 34 and 35 are in contact with the NPN regions 11, 12 and 13, respectively. A pair of electrodes 37, 38 are attached to the emitter and base regions, N-region 11 and P-region 12, respectively and an electrode (not shown) is attached to the collector region 13.

Unnecessary parts of the glassy layer 30 may be removed by etching as above leaving a glass area 31 surrounding the second P-N junction 16*c* which is then passivated as the junction 16*e*. The glass areas 21 and 31 define the first and second mesas. Similarly, unnecessary portions of the collector or N-region 13 may be removed, FIGS. 7 and 8. The substrate 10 is thus of a double mesa, 21, 31 circular configuration with the collector region 13 having a circular wall 40 and the surface 41 exposed by the etching of glass layer 30. Other geometric configurations for a double mesa semiconductor device such as square, rectangular or oval are equally within the scope of this invention.

The preferred glass former in accordance with this invention is lead or lead oxide, but other elements and mixtures thereof such as aluminum, beryllium, magnesium, zinc, cadmium, tin and metal halides, particularly fluorides, can also be employed.

While the foregoing has described the production of an NPN transistor, it will be seen that PNP transistors can also be produced by similar manufacturing processes. Furthermore, this invention is equally applicable to the production of other types of semiconductor devices including a plurality of circuit members such as networks, semiconductors, integrated circuits or combinations of these formed on a common substrate while being electrically isolated from one another.

In view of the geometry of the device described, it is not necessary to control the depth of penetration of the glassy layers 20 and 30 respectively with great accuracy.

Although minor modifications might be suggested by those versed in the art, it should be understood that I wish to embody within the scope of the patent warranted hereon all such embodiments as reasonably and properly come within the scope of my contribution to the art.

I claim as my invention:

1. A method of making a passivated semiconductor device comprising the steps of:
- (a) providing a substrate having two flat P–N junctions, said junctions being formed by regions of positive and negative conductivity in layers;
- (b) applying a glass former layer over a selected area of one conductivity region of said substrate;
- (c) heating the resulting substrate under oxidizing conditions to cause formation and diffusion of a first glassy layer extending through the first region of the substrate;
- (d) forming a mask over a portion of the glassy layer and the non-selected area of the substrate;
- (e) removing the glassy layer from the non-masked area of the substrate to expose the second conductivity region;
- (f) applying a glass former layer over a selected portion of the exposed second region;
- (g) heating the resulting substrate under oxidizing conditions to cause formation and diffusion of a second glassy layer extending through the second region;
- (h) selectively removing the oxide which is formed during the heating step from the substrate;
- (i) depositing a conductive material in the selectively removed areas; and
- (j) applying metal electrodes to the conductive material.

2. A method of making a passivated semiconductor device as recited in claim 1 wherein the step of heating is at 700–900° C.

3. A method of making a passivated semiconductor device as recited in claim 1 wherein the glass former layer is chosen from the group of elements consisting of lead, magnesium, beryllium, aluminum, zinc, cadmium, tin, metal halides and mixtures thereof.

4. A method of making a passivated semiconductor device as recited in claim 1 wherein the step of forming a mask is with a metal selected from the group consisting of gold and platinum.

5. A method of making a passivated semiconductor device as recited in claim 1 wherein the substrate is silicon having layers of NPN material.

6. A method of making a passivated semiconductor device as recited in claim 1 wherein the first glassy layer surrounds the emitter region.

7. A method of making a passivated semiconductor device as recited in claim 1 wherein said semiconductor substrate is silicon and said glass former includes lead.

References Cited

UNITED STATES PATENTS

| | | | |
|---|---|---|---|
| 3,237,272 | 3/1966 | Kallander | 29—25.3 |
| 3,241,010 | 3/1966 | Eddleston | 317—234 |
| 3,410,736 | 11/1968 | Tokuyama et al. | 148—186 |
| 3,442,011 | 5/1969 | Strieter | 29—578 |
| 3,447,237 | 6/1969 | Tokuyama et al. | 29—590 |
| 3,447,958 | 6/1969 | Okutsu et al. | 117—201 |

L. DEWAYNE RUTLEDGE, Primary Examiner

W. G. SABA, Assistant Examiner

U.S. Cl. X.R.

29—578; 117—201, 212; 148—1.5, 175; 317—234, 235